United States Patent
Shin et al.

(10) Patent No.: US 9,322,868 B2
(45) Date of Patent: Apr. 26, 2016

(54) TEST CIRCUIT AND METHOD OF SEMICONDUCTOR INTEGRATED CIRCUIT

(71) Applicant: SK hynix Inc., Icheon-si Gyeonggi-do (KR)

(72) Inventors: Sang Hoon Shin, Icheon-si (KR); Tae Yong Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/586,515

(22) Filed: Dec. 30, 2014

(65) Prior Publication Data

US 2015/0123698 A1    May 7, 2015

Related U.S. Application Data

(63) Continuation-in-part of application No. 13/421,087, filed on Mar. 15, 2012.

(30) Foreign Application Priority Data

Apr. 27, 2011    (KR) ........................ 10-2011-0039472

(51) Int. Cl.
| | |
|---|---|
| *G01R 31/02* | (2006.01) |
| *G01R 31/26* | (2014.01) |
| *H01L 21/66* | (2006.01) |
| *G01R 31/3185* | (2006.01) |
| *G01R 31/28* | (2006.01) |
| *G01R 31/30* | (2006.01) |
| *H01L 23/00* | (2006.01) |

(52) U.S. Cl.
CPC ........ *G01R 31/2607* (2013.01); *G01R 31/2853* (2013.01); *G01R 31/3008* (2013.01); *G01R 31/318513* (2013.01); *H01L 22/30* (2013.01); *H01L 22/34* (2013.01); *H01L 24/16* (2013.01); *H01L 2224/16145* (2013.01); *H01L 2924/00014* (2013.01)

(58) Field of Classification Search
CPC ................... G01R 31/318513; G01R 31/2884; G01R 31/2853; G01R 31/2607
USPC ................ 324/762.01–762.1, 756.03, 750.3, 324/750.16, 750.01, 754.03; 257/48, 774, 257/E23.011, 777, 686, E21.531, E23.145, 257/E21.614
See application file for complete search history.

(56) References Cited

U.S. PATENT DOCUMENTS

| | | | |
|---|---|---|---|
| 6,550,038 B2 | 4/2003 | Shirata | |
| 7,453,282 B2 * | 11/2008 | Arnold et al. | ................... 326/16 |
| 2006/0273820 A1 | 12/2006 | Arnold et al. | |
| 2010/0013512 A1 | 1/2010 | Hargan et al. | |
| 2011/0080185 A1 * | 4/2011 | Wu et al. | ..................... 324/750.3 |
| 2011/0102006 A1 * | 5/2011 | Choi et al. | ................. 324/750.3 |
| 2011/0234285 A1 * | 9/2011 | Kim et al. | ....................... 327/292 |
| 2012/0025846 A1 * | 2/2012 | Minas et al. | .................. 324/606 |

FOREIGN PATENT DOCUMENTS

| | | |
|---|---|---|
| CN | 1869724 A | 11/2006 |
| JP | 2008-096312 A | 4/2008 |

* cited by examiner

*Primary Examiner* — Daniel Miller
(74) *Attorney, Agent, or Firm* — William Park & Associates Ltd.

(57) ABSTRACT

A test circuit of a semiconductor integrated circuit includes a through via, a voltage driving unit, and a determination unit. The through via is charged by receiving an input voltage. The voltage driving unit generates a test voltage by charging or discharging the through via in response to a test control signal. The determination unit compares levels of the input voltage and the test voltage and outputs a resultant signal.

17 Claims, 6 Drawing Sheets

US 9,322,868 B2

TEST CIRCUIT AND METHOD OF SEMICONDUCTOR INTEGRATED CIRCUIT

CROSS-REFERENCES TO RELATED APPLICATION

The application is a continuation-in-part of the U.S. patent application Ser. No. 13/421,087 filed Mar. 15, 2012 and titled "TEST CIRCUIT AND METHOD OF SEMICONDUCTOR INTEGRATED CIRCUIT", which is incorporated herein by reference in its entirety.

BACKGROUND

1. Technical Field

The present invention relates generally to a semiconductor integrated circuit, and more particularly, to a test circuit and method of testing a semiconductor integrated circuit.

2. Related Art

A three-dimensional (3D) semiconductor integrated circuit formed by, for example, packaging a plurality of stacked chips into a single package is one form of elevating the degree of integration to a higher level. By stacking two or more chips over each other vertically, the 3D semiconductor integrated circuit can achieve a high degree of integration in a given space.

There are various schemes for realizing a 3D semiconductor integrated circuit. In one scheme, a plurality of the structurally same chips are stacked, and the stacked chips are coupled to each other by wires such as metal lines, so as to allow the stacked chips to operate as a single semiconductor integrated circuit.

In a through-silicon via (TSV) type semiconductor apparatus, silicon vias are formed through a plurality of stacked chips so that all the chips can be electrically connected to each other through the silicon vias instead of the metal lines. In the TSV type semiconductor apparatus, since the chips are electrically connected to each other through the silicon vias vertically passing through the chips, it is possible to further reduce the area of a package, as compared to a semiconductor integrated circuit in which the chips are electrically connected to each other through bonding wirings bonded adjacent to the edges of the chips.

The TSVs are formed generally in a packaging process after which all chips stacked in parallel to each other can to be connected to each other. However, the TSVs may be formed in advance in the chip fabricating process in order to connect the stacked chips to one another. For example, as illustrated in FIG. 1, the TSVs are formed in advance in a chip fabricating process such that the TSVs of the first and second chips are coupled to the internal circuits of the first and second chips respectively. Then, in a packaging process, while the first chip and the second chip are stacked, the TSV of the first chip is coupled to the internal circuit of the second chip through a bump, so that a serial connection can be achieved in the following sequence of: the internal circuit of the first chip, the TSV of the first chip, the internal circuit of the second chip, and the TSV of the second chip.

A current leakage test is mainly used for determining whether the TSVs are formed normally. In general, a test is performed after a plurality of chips are stacked and packaged. However, since the TSVs for the serial or parallel connection can be formed in a chip fabricating process as described above, it is necessary to perform a test for determining whether the TSVs have been normally formed in a wafer level.

SUMMARY

A test circuit and method of testing a semiconductor integrated circuit whether defected TSVs are formed in a single chip on a wafer and whether defected TSVs are formed in a packaged semiconductor integrated circuit are described.

In an embodiment of the present invention, a test circuit of a semiconductor integrated circuit includes: a through-silicon via configured to be charged by receiving an input voltage; a voltage driving unit configured to generate a test voltage by charging or discharging the through-silicon via in response to a test control signal; and a determination unit configured to compare levels of the input voltage and the test voltage and output a resultant signal.

In an embodiment of the present invention, a semiconductor integrated circuit includes: a first chip including a first chip through-silicon via configured to be charged by receiving an input voltage, a first chip voltage driving unit electrically connected with the first chip through-silicon via and configured to generate a first chip test voltage by charging or discharging the first chip through-silicon via, and a first chip determination unit configured to compare levels of the input voltage and the first chip test voltage and generate a first chip resultant signal; and a second chip including a second chip through-silicon via electrically connected with the first chip through-silicon via and configured to be charged by receiving the input voltage through the first chip through-silicon via, a second chip voltage driving unit configured to generate a second chip test voltage by charging or discharging the second chip through-silicon via, and a second chip determination unit configured to compare levels of the input voltage and the second chip test voltage and generate a second chip resultant signal.

A test method of a semiconductor integrated circuit according to an embodiment of the present invention includes: charging a through-silicon via by applying an input voltage; generating a first test voltage by charging or discharging the through-silicon via for a first time; comparing levels of the input voltage and the first test voltage and generating a first resultant signal; generating a second test voltage by charging or discharging the through-silicon via for a second time; and comparing levels of the input voltage and the second test voltage and generating a second resultant signal.

BRIEF DESCRIPTION OF THE DRAWINGS

Features, aspects, and embodiments are described in conjunction with the attached drawings, in which.

DETAILED DESCRIPTION

Figure 1:
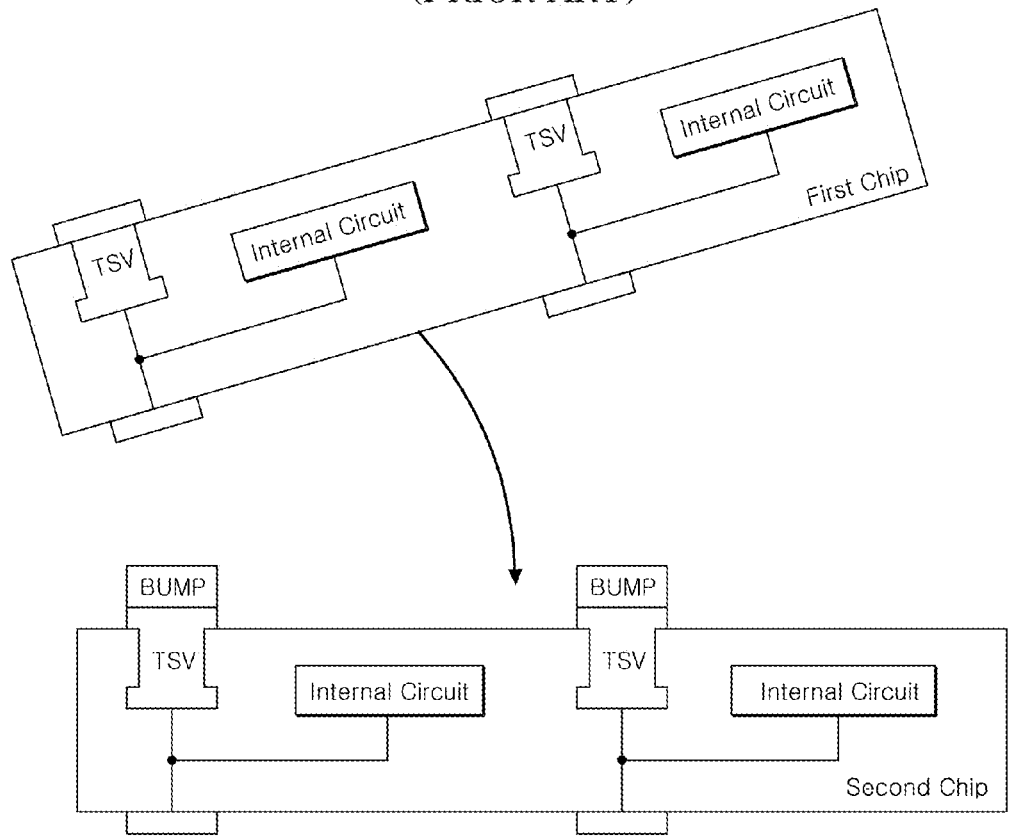
FIG. 1 illustrates stacking of a plurality of chips constituting a semiconductor integrated circuit.
Figure 1:
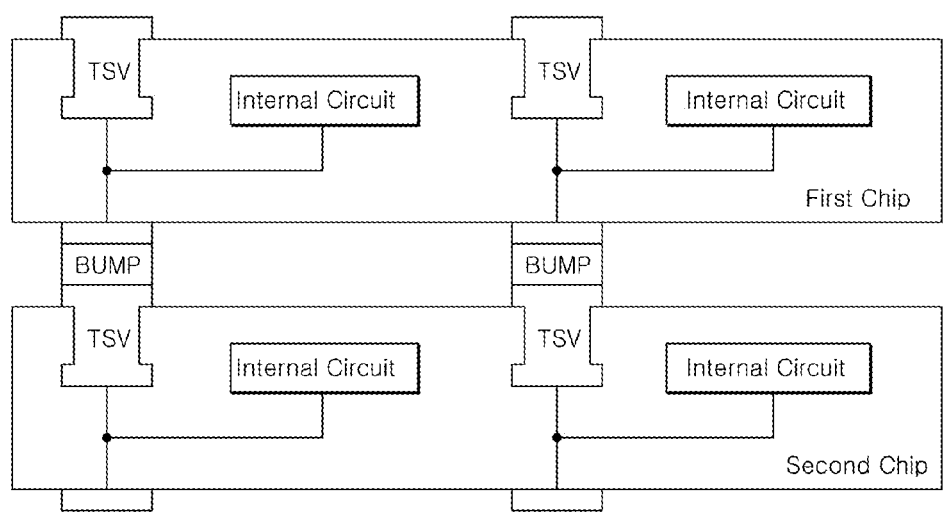
Figure 2:
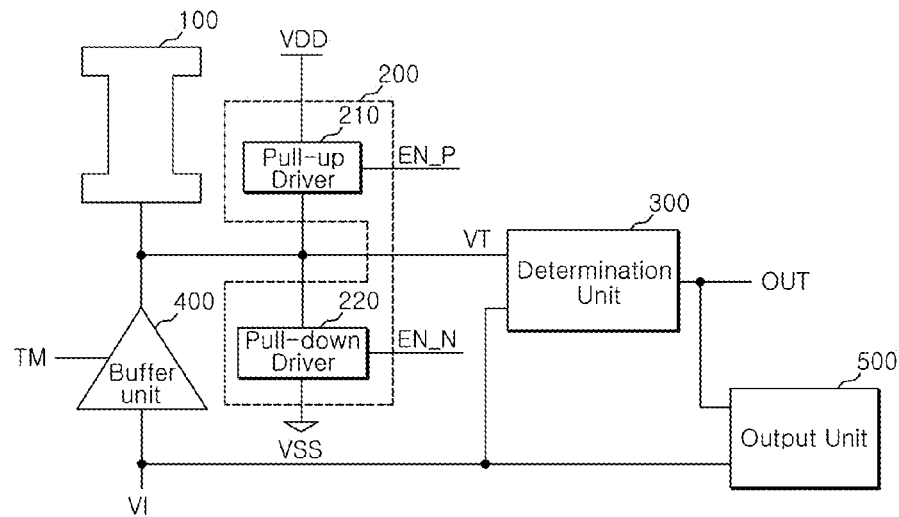
FIG. 2 illustrates the configuration of a test circuit of a semiconductor integrated circuit according to an exemplary embodiment of the present invention.

Hereinafter, a test circuit and method of testing a semiconductor integrated circuit according to exemplary embodiments of the present invention will be described in detail with reference to the accompanying drawings FIG. 2 illustrates a test circuit 1 of a semiconductor integrated circuit according to an exemplary embodiment of the present invention. In FIG. 2, the test circuit 1 of a semiconductor integrated circuit includes a TSV 100, a voltage driving unit 200, and a determination unit 300. The TSV 100 is formed through a chip (not shown) to electrically connect the chip having the TSV 100 to another chip. The TSV 100 may be formed by filling a conductive material in a silicon via, which is formed with an insulating material on the via wall. In this regard, when the TSV 100 is not electrically connected to another chip, the TSV 100 may operate as a capacitor. The TSV 100 receives an input voltage VI from the buffer unit 400 for a test of the semiconductor integrated circuit. The TSV 100 may be charged by receiving the input voltage VI.

The voltage driving unit 200 is configured to generate a test voltage VT by charging or discharging the TSV 100. The voltage driving unit 200 is configured to change the voltage level of the TSV 100 by charging or discharging the TSV 100 in response to test control signals EN_P and EN_N. In order to improve the efficiency and accuracy of a test operation, the test control signals include first and second test control signals EN_P1, EN_N1, and EN_P2, EN_N2 (refer to FIG. 5). The first and second test control signals EN_P1, EN_N1, and EN_P2, EN_N2 may be generated from a test mode signal TM informing the test operation. Otherwise, the first and second test control signals may be generated from a fuse signal or a signal used in a mode register set of the semiconductor integrated circuit. The first and second test control signals EN_P1, EN_N1, and EN_P2, EN_N2 may be activated at different time points from each other. Furthermore, the first and second test control signals EN_P1, EN_N1, and EN_P2, EN_N2 may have pulse widths different from each other. It is possible to perform various types of tests by the first and second test control signals EN_P1, EN_N1, and EN_P2, EN_N2 which are activated at different time points from each other and have the pulse widths different from each other.

In FIG. 2, the voltage driving unit 200 may include one or more of a pull-up driver 210 and a pull-down driver 220. The pull-up driver 210 is configured to pull-up drive the TSV 100 and charge the TSV 100, in response to the test control signals EN_P1 and EN_P2. The pull-down driver 220 is configured to pull-down drive the TSV 100 and discharge the TSV 100, in response to the test control signals EN_N1 and EN_N2. When the input voltage VI is a high voltage, that is, a logic high level, the TSV 100 may be charged to have the level of the high voltage, and the voltage driving unit 200 may discharge the TSV 100 through the pull-down driver 220 and generate the test voltage VT. When the input voltage VI is a low voltage, that is, a logic low level, the TSV 100 may be charged to have the level of the low voltage, and the voltage driving unit 200 may charge the TSV 100 through the pull-up driver 210 and generate the test voltage VT. FIG. 2 illustrates an example in which the pull-up driver 210 pull-up drives the TSV 100 with the level of an external voltage VDD and the pull-down driver 220 pull-down drives the TSV 100 with the level of a ground voltage VSS.

The determination unit 300 is configured to receive the input voltage VI and the test voltage VT. The determination unit 300 is configured to compare the input voltage VI with the test voltage VT and output a resultant signal OUT. For example, when the logic level of the input voltage VI is substantially the same as that of the test voltage VT, the determination unit 300 deactivates the resultant signal OUT. When the logic level of the input voltage VI is different from that of the test voltage VT, the determination unit 300 activates the resultant signal OUT. With such a configuration, the test circuit 1 of the semiconductor integrated circuit according to an embodiment may charge the TSV 100 with the input voltage VI having a desired level, generate the test voltage VT by charging or discharging the charged TSV 100, and determine whether the TSV 100 is normal, by comparing the level of the input voltage VI transmitted from the TSV 100 with the level of the test voltage VT.

In FIG. 2, the test circuit 1 further includes a buffer unit 400 configured to provide the input voltage VI to the TSV 100 in response to the test mode signal TM. The buffer unit 400 is configured to provide the input voltage VI for the activation period of the test mode signal TM. Thus, the buffer unit 400 charges the TSV 100 with the input voltage VI in response to the test mode signal TM.

In FIG. 2, the test circuit 1 may further include an output unit 500. The output unit 500 is configured to output one of the input voltage VI and the resultant signal OUT in response to the test mode signal TM. When the semiconductor integrated circuit is performing a test operation by utilizing the test circuit 1, the output unit 500 outputs the resultant signal OUT. When the test operation is ended, the output unit 500 outputs the input voltage VI such that the input voltage VI is available for various internal circuits included in the semiconductor integrated circuit. The output unit 500 may be, for example, a multiplexer circuit which outputs one of the input voltage VI and the resultant signal OUT according to the test mode signal TM. Also, when the test operation is ended, the output unit 500 may lock the level of the resultant signal OUT to a constant level.

Figure 3:
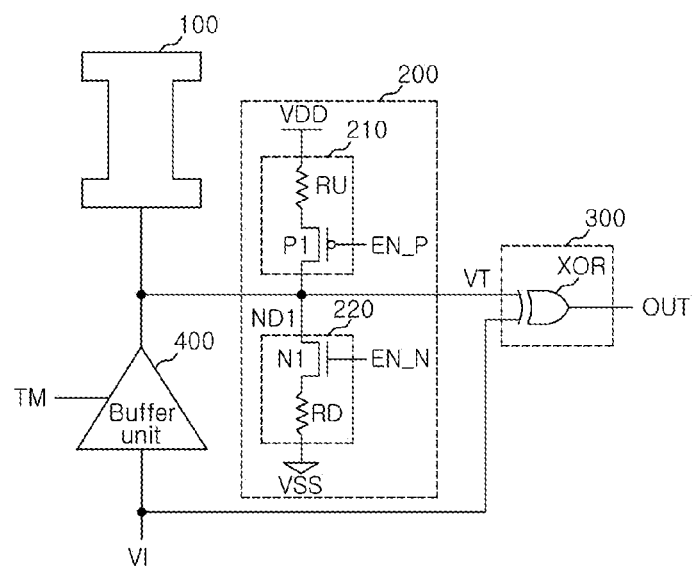
FIG. 3 illustrates the configuration of the test circuit illustrated in FIG. 2 according to the exemplary embodiment.

FIG. 3 illustrates the configuration of the test circuit 1 illustrated in FIG. 2 according to an embodiment of the present invention. The buffer unit 400 applies the input voltage VI to a first node ND1 in response to the test mode signal TM, thereby charging the TSV 100.

As shown in FIG. 3, the pull-up driver 210 of the voltage driving unit 200 may comprise a first PMOS transistor P1, and the pull-down driver 220 may comprise a first NMOS transistor N1. The first PMOS transistor P1 has a gate which receives the test control signal EN_P, a source terminal which receives the external voltage VDD, and a drain terminal which is connected to the first node ND1. The first NMOS transistor N1 has a gate which receives the test control signal EN_N, a source terminal which is connected to the ground voltage VSS, and a drain terminal which is connected to the first node ND1. Thus, when the voltage level of the first node ND1 is a low level voltage, the first PMOS transistor P1 can drive the first node ND1 with the level of the external voltage VDD and generate the test voltage VT, in response to the test control signal EN_P. To the contrary, when the voltage level of the first node ND1 is a high level voltage, the first NMOS transistor N1 can drive the first node ND1 with the level of the ground voltage VSS and generate the test voltage VT, in response to the test control signal EN_N.

As illustrated in FIG. 3, the pull-up driver 210 and pull-down driver 220 may further include resistors RU and RD, respectively. The resistors RU and RD are provided in order to adjust the driving force of the pull-up driver 210 and the driving force of the pull-down driver 220, respectively. Also, it is possible to adjust the driving force of the pull-up driver 210 and the driving force of the pull-down driver 220 by adjusting the size of the first PMOS transistor P1 and the first NMOS transistor N1.

In FIG. 3, the test circuit 1 may further include a differential amplifier (not illustrated) that receives and differentially amplifies the test voltage VT and the input voltage VI. Since the differential amplifier compares the test voltage VT with the input voltage VI to amplify the test voltage VT to a high level or a low level, a logic operation of the determination unit 300 is facilitated. Consequently, in the case of using the differential amplifier, a more accurate test result can be achieved. Furthermore, the differential amplifier may be used instead of the determination unit 300.

FIG. 3 illustrates an example in which the determination unit 300 comprises an XOR gate. The XOR gate is configured to receive the test voltage VT from the first node ND1 and receive the input voltage VI. Thus, when the logic level of the test voltage VT is substantially the same as that of the input voltage VI, the XOR gate deactivates the resultant signal OUT. When the logic level of the test voltage VT is different from that of the input voltage VI, the XOR gate activates the resultant signal OUT.

Figure 4A:
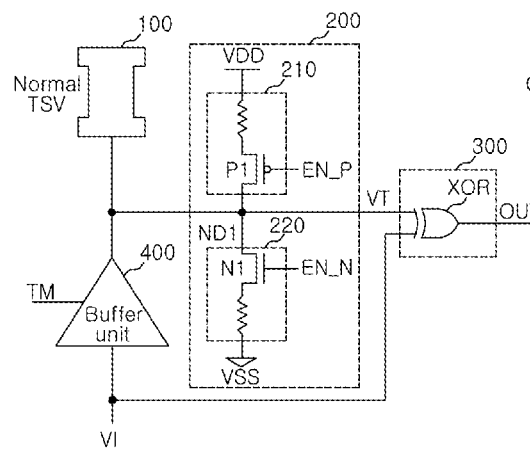
FIG. 4A illustrates a test circuit coupled to a normal TSV and FIGS. 4B-4D illustrate test circuits coupled to various types of defected TSVs.
Figure 4B:
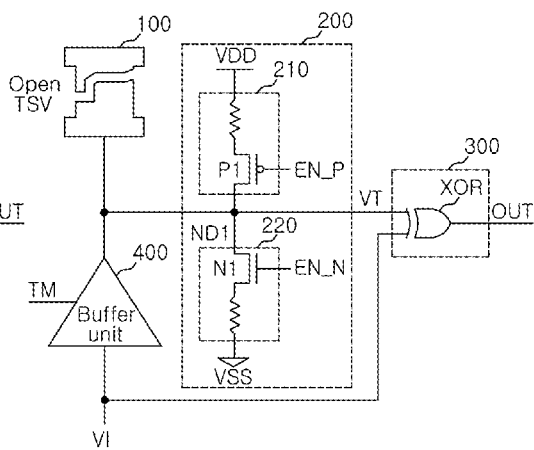
Figure 4C:
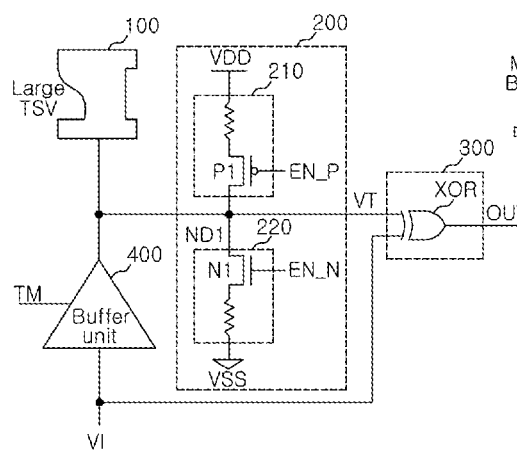
Figure 4D:
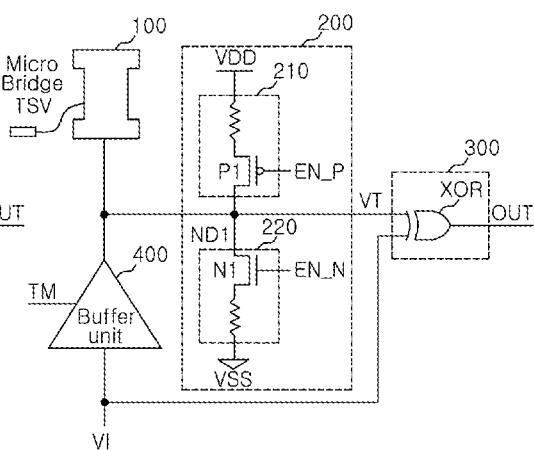

FIGS. 4A-4D illustrate the test circuits coupled to a normal TSV and various types of defected TSVs. FIG. 4A illustrates a normally formed TSV, FIG. 4B illustrates a physically or electrically open TSV, FIG. 4C illustrates a large TSV with a large amount of via and conductive material, and FIG. 4D illustrates a micro bridge TSV that causes current leakage through a micro bridge formed in another circuit or another TSV constituting the semiconductor integrated circuit. The test circuit 1 of the semiconductor integrated circuit according to an embodiment is configured to detect these and other various types of defected TSVs shown in FIGS. 4A-4D.

FIGS. 5 to 8 are timing diagrams corresponding to FIGS. 4A-4D illustrating the operation of the test circuit 1 of the semiconductor integrated circuit according to an embodiment. The operation of the test circuit 1 of the semiconductor integrated circuit according to an embodiment will be described with reference to FIGS. 2 to 8 below.

Figure 5:
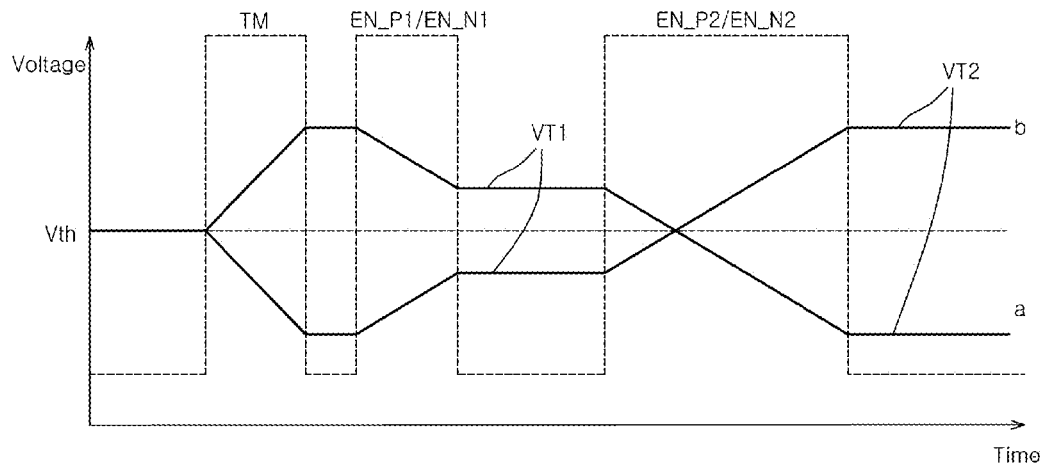
FIG. 5 is an exemplary timing diagram of a result that may be obtained by testing a normal TSV of FIG. 4A through a test circuit according to an exemplary embodiment of the present invention.

FIG. 5 is a timing diagram illustrating a test result of a normal TSV such as that shown in FIG. 4A. A test operation of the semiconductor integrated circuit starts in response to the test mode signal TM. When the test mode signal TM is activated, the buffer unit 400 is activated to transmit the input voltage VI to the TSV 100. The "case a" in which the input voltage VI is a high level voltage will be described below.

When the input voltage VI of high level is transmitted to the TSV 100 in response to the test mode signal TM, the TSV 100 is charged with the input voltage VI. Then, when the first test control signal EN_N1 is activated, the first NMOS transistor N1 of the pull-down driver 220 is turned on, and the voltage level of the first node ND1, that is, the voltage level of the TSV 100, is reduced to the level of the ground voltage VSS. The activation period of the first test control signal EN_N1 is set such that a first test voltage (VT1, which denotes a test voltage VT reduced by the first test control signal EN_N1) can maintain a level above a reference voltage (Vth, which typically has a level corresponding to ½ of the external voltage VDD and the ground voltage VSS) and be determined as a logic high although the normal TSV 100 is charged with the input voltage VI and discharged by the first test control signal EN_N1. That is, although discharge occurs by the first test control signal EN_P1, the first test voltage VT1 is set to be a high level. Since the first test voltage VT1 has a logic value substantially the same as that of the input voltage VI, the determination unit 300 outputs a deactivated resultant signal OUT.

Then, when the second test control signal EN_N2 is activated, the first NMOS transistor N1 is turned on again, and the voltage level of the first node ND1 is reduced to the level of the ground voltage VSS again. The activation period of the second test control signal EN_N2 is set such that the level of the first test voltage VT1 reduced by the first test control signal EN_N1 is reduced below the reference voltage Vth and can be determined as a logic low. Thus, since a second test voltage VT2 (which denotes a test voltage VT generated by reducing the first test voltage VT1 by the second test control signal EN_N2) is at a low level, the determination unit 300 outputs an activated resultant signal OUT.

To the contrary, in the "case b" of FIG. 5 in which the input voltage VI at a low level is applied, the TSV 100 is charged with a low level voltage. When the first test control signal EN_P1 is activated, the first PMOS transistor P1 of the pull-up driver 210 is turned on and the external voltage VDD is applied to the first node ND1. The activation period of the first test control signal EN_P1 is set such that the normal TSV 100 is charged with the low level voltage and the first test voltage VT1 is maintained at a logic low level although the external voltage VDD is applied. Since the first test voltage VT1 has a logic level substantially the same as that of the input voltage VI, the determination unit 300 outputs a deactivated resultant signal OUT.

Then, when the second test control signal EN_P2 is activated, the first PMOS transistor P1 is turned on again and the external voltage VDD is applied to the first node ND1, so that the second test voltage VT2 is at a logic high level. The activation period of the second test control signal EN_P2 is set such that the increased level of the first test voltage VT1 is above the reference voltage Vth and can be determined as a logic high. Since the second test voltage VT2 has a logic level different from that of the input voltage VI, the determination unit 300 outputs an activated resultant signal OUT.

As described above, the first test control signals EN_P1 and EN_N1 and the second test control signals EN_P2 and EN_N2 are activated at different points of time and have different pulse widths. This may be variously changed according to the type of a test and the intention of a designer. So far, the above cases have been described, in which when the normal TSV is charged or discharged for the activation periods of the first test control signals EN_P1 and EN_N1, the test voltage VT has a logic level substantially the same as that of the input voltage VI, and when the normal TSV is charged or discharged for the activation periods of the second test control signals EN_P2 and EN_N2, the test voltage VT has a logic level different from that of the input voltage VI. In such cases, test results of the defected TSVs illustrated in FIG. 4 show waveforms different from those illustrated in FIG. 5.

Figure 6:
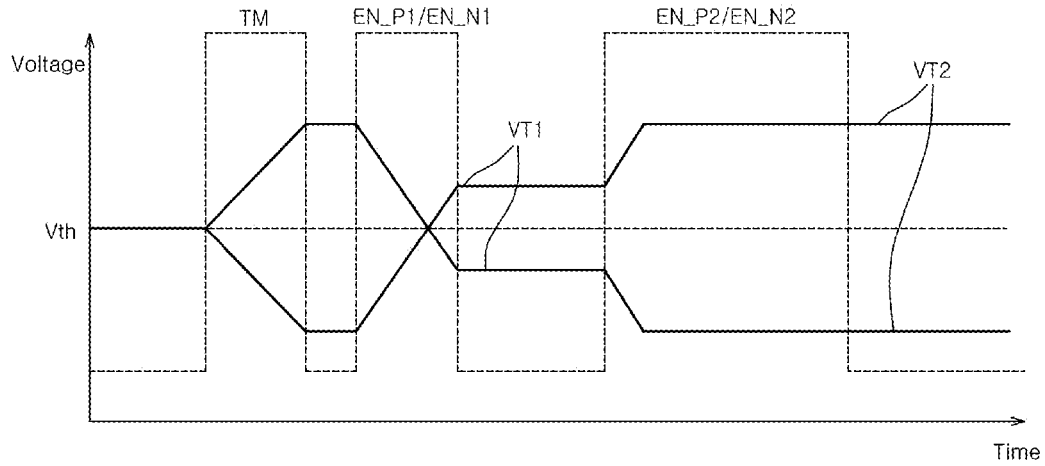
FIGS. 6 to 8 are exemplary timing diagrams of the results that may be obtained by testing defected TSVs of FIGS. 4B-4D respectively through a test circuit according to an exemplary embodiment of the present invention.
Figure 7:
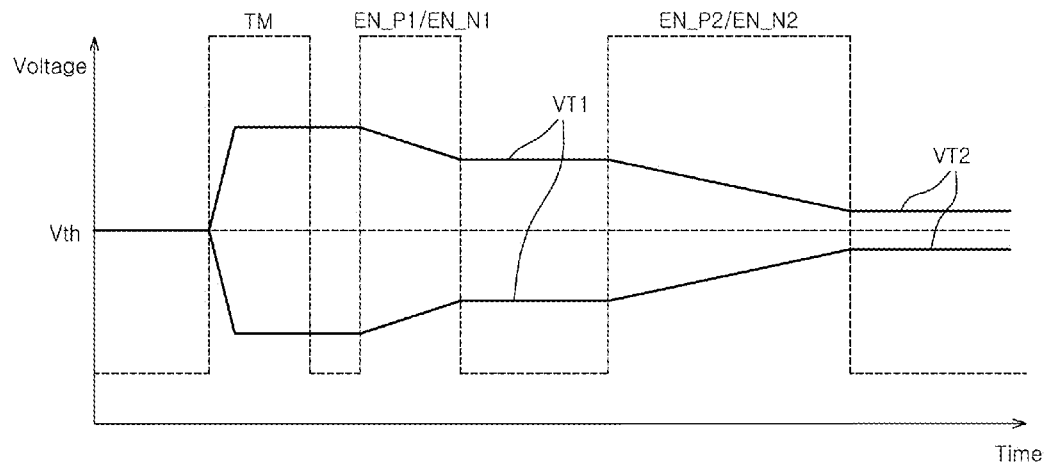
Figure 8:
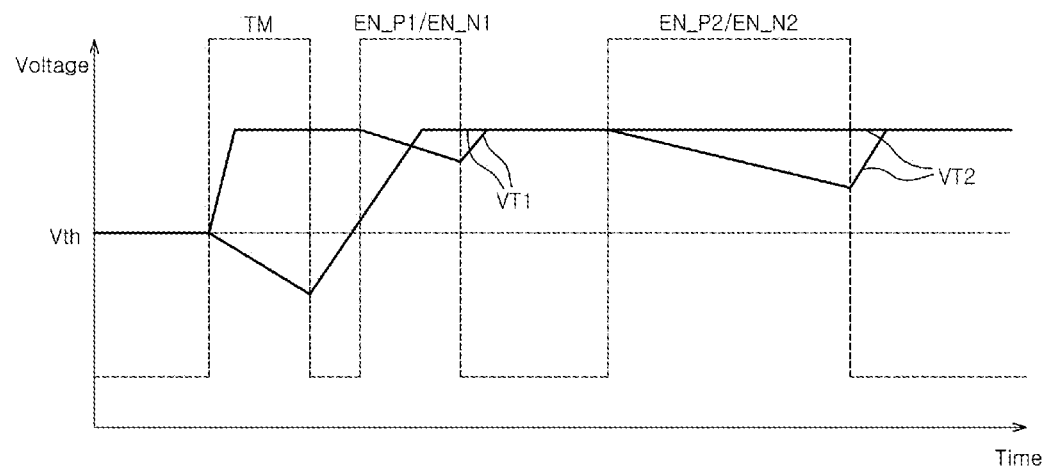

FIGS. 6 to 8 are timing diagrams illustrating results obtained by testing defected TSVs shown in FIGS. 4B-4D through the test circuit 1 according to an embodiment. In FIG. 6, for the activation periods of the first test control signals EN_P1 and EN_N1, the first test voltage VT1 already has a level different from that of the input voltage VI. Thus, after the activation periods of the first test control signals EN_P1 and EN_N1, the determination unit 300 outputs a resultant signal OUT at a high level. Consequently, it is possible to determine that the TSV 100 is defected. FIG. 6 illustrates an example in which the TSV 100 is rapidly discharged to the ground voltage or changed with the external voltage by the first test control signals EN_P1 and EN_N1, as compared with a normal case. Consequently, it is possible to determine that the TSV 100 is not a normal TSV but an open TSV illustrated in FIG. 4B.

As illustrated in FIG. 7, after the activation periods of the first test control signals EN_P1 and EN_N1 and the second test control signals EN_P2 and EN_N2, when the levels of the test voltages VT1 and VT2 are not different from that of the input voltage VI, since it can be determined that the TSV 100 has a very large capacity, it can be understood that the TSV 100 is a large TSV illustrated in FIG. 4C.

As illustrated in FIG. 8, when the levels of the test voltages VT1 and VT2 are continuously maintained at high levels regardless of whether the input voltage VI is a high voltage or a low voltage, it can be determined that a micro bridge is formed in the TSV 100 with respect to the external voltage. Consequently, it can be understood that the TSV 100 showing the waveform illustrated in FIG. 8 is a micro bridge TSV illustrated in FIG. 4D.

As described above, the test circuit 1 of the semiconductor integrated circuit according to an embodiment can simply and accurately check whether the TSV formed in a single chip is defected and the defective types.

Figure 9:
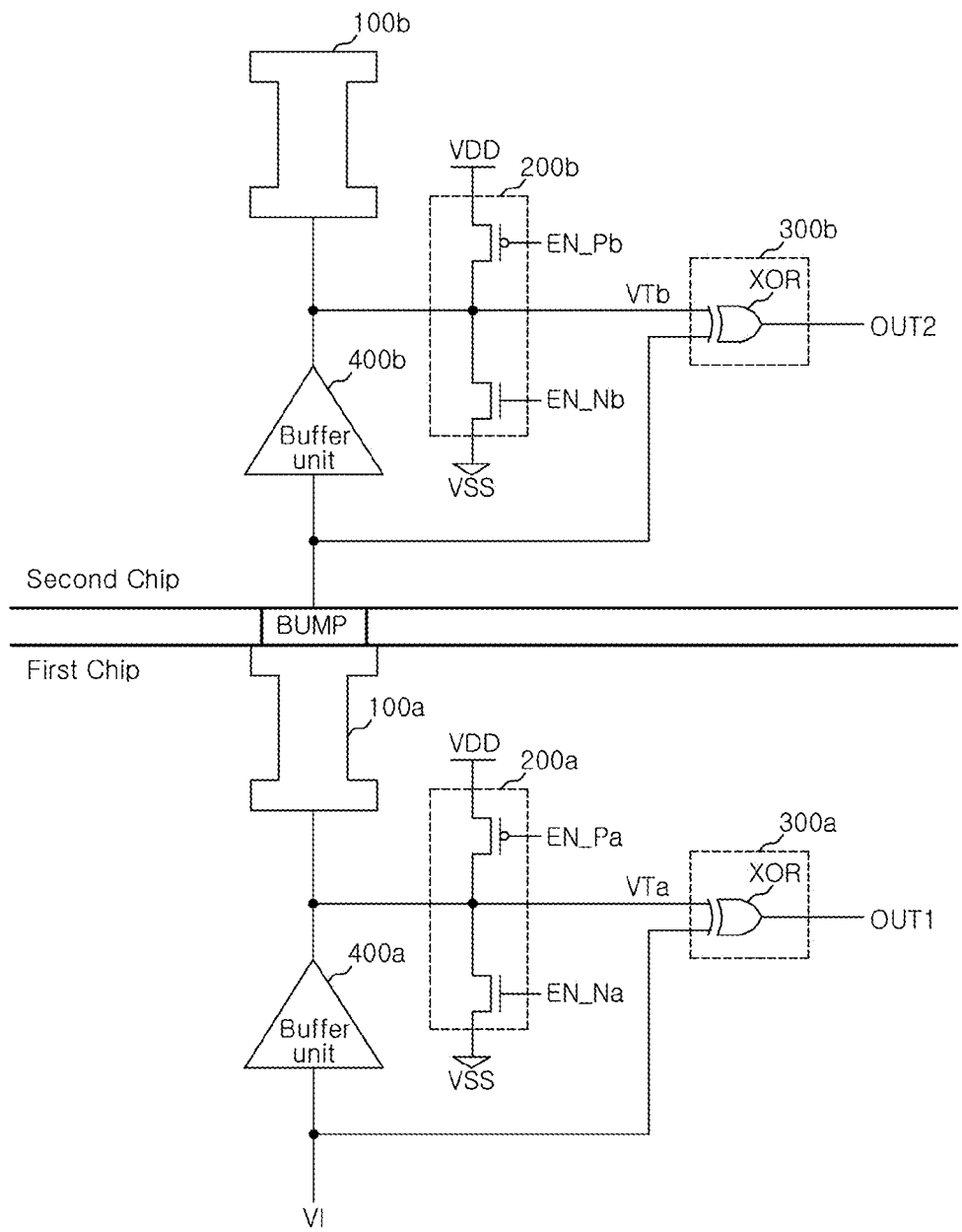
FIG. 9 illustrates a semiconductor integrated circuit having stacked chips, each chip including a test circuit according to an exemplary embodiment of the present invention.

FIG. 9 illustrates a semiconductor integrated circuit according to an embodiment. In FIG. 9, a semiconductor integrated circuit 2 includes two chips (i.e., a first chip and a second chip) including the test circuit 1 according to an embodiment. The first chip and the second chip can be vertically stacked and packaged into a single semiconductor integrated circuit. The first chip and the second chip include the test circuit according to an embodiment, and the test circuit of the first chip 200a, 300a, 400a, a TSV 100a of the first chip, the test circuit of the second chip 200b, 300b, 400b, and a TSV 100b of the second chip can be electrically connected to each other through a bump BUMP. The first chip includes a first chip voltage driving unit 200a and a first chip determination unit 300a, and the second chip includes a second chip voltage driving unit 200b and a second chip determination unit 300b. When the first chip and the second chip are stacked and electrically connected to each other, the first chip voltage driving unit 200a is deactivated. That is, first chip test control signals EN_Pa and EN_Na are not activated. The second chip voltage driving unit 200b can be activated in response to second chip test control signals EN_Pb and EN_Nb to perform a test. Consequently, whether the TSV 100a of the first chip and the TSV 100b of the second chip are defected can be determined by the second chip voltage driving unit 200b and the second chip determination unit 300b at a time.

The input voltage VI may be applied to the TSV 100b through the TSV 100a of the first chip and the bump BUMP. The TSV 100b may be charged by receiving the input voltage VI. The first chip voltage driving unit 200a of the first chip is in the deactivated state. The second chip voltage driving unit 200b generates a second chip test voltage VTb by charging or discharging the TSV 100b in response to the second chip test control signals EN_Pb and EN_Nb. The second chip determination unit 300b compares the second chip test voltage VTb with the input voltage VI to generate a second chip resultant signal OUT2. Consequently, when one or more of the TSV 100a of the first chip and the TSV 100b of the second chip are defected, a test result may be different from a normal result. Meanwhile, when the TSV 100a of the first chip is an open TSV, the input voltage VI may not be normally transmitted to the second chip. However, even in such a case, it is possible to generate a resultant signal including information regarding that a TSV is failed, according to an embodiment.

Before the first chip and the second chip are stacked, a test for the TSV 100a of the first chip is performed by the first chip voltage driving unit 200a and the first chip determination unit 300a. Thus, the first chip voltage driving unit 200a generates a first chip test voltage VTa by charging or discharging the TSV 100a, and the first chip determination unit 300a compares the first chip test voltage VTa with the input voltage VI to generate a first chip resultant signal OUT1. Similarly, a test for the TSV 100b of the second chip is performed by the second chip voltage driving unit 200b and the second chip determination unit 300b. Thus, the second chip voltage driving unit 200b generates the second chip test voltage VTb by charging or discharging the TSV 100b, and the second chip determination unit 300b compares the second chip test voltage VTb with the input voltage VI to generate the second chip resultant signal OUT2. Consequently, in the case of a single chip in which the first chip and the second chip are separated from each other, it is possible to individually perform tests for TSVs of the respective chips.

When the first chip and the second chip are stacked to form a single semiconductor integrated circuit, the first chip voltage driving unit 200a is deactivated as described above, so that tests for the TSV 100a of the first chip and the TSV 100b of the second chip can be performed by the second chip voltage driving unit 200b and the second chip determination unit 300b.

While certain embodiments have been described above, it will be understood to those skilled in the art that the embodiments described are by way of example only. Accordingly, the test circuit and method of a semiconductor integrated circuit described herein should not be limited based on the described embodiments. Rather, the test circuit and method of a semiconductor integrated circuit described herein should only be limited in light of the claims that follow when taken in conjunction with the above description and accompanying drawings.

What is claimed is:

1. A test circuit of a semiconductor integrated circuit, comprising:
   a through via configured to be charged by receiving an input voltage;
   a voltage driving unit configured to generate a test voltage by supplying an additional charge to the charged through via using an external voltage or discharging the charged through via using a ground voltage in response to a test control signal; and
   a determination unit configured to compare levels of the input voltage and the test voltage and output a resultant signal based on the comparison of the levels of the input voltage and the test voltage.

2. The test circuit according to claim 1, further comprising:
   a buffer unit configured to provide the input voltage to the through via in response to a test mode signal.

3. The test circuit according to claim 1,
   wherein the test control signal includes a first test control signal and a second test control signal,
   wherein the first test control signal and the second test control signal are activated at time points different from each other, and
   wherein the first test control signal and the second test control signal have different pulse widths.

4. The test circuit according to claim 3, wherein the voltage driving unit generates a first test voltage by charging or discharging the through via for a first time, and generates a second test voltage by charging or discharging the through via for a second time.

5. The test circuit according to claim 1, wherein the voltage driving unit comprises a pull-up driver which is configured to pull-up drive the through via and charge the through via, in response to the test control signal.

6. The test circuit according to claim 1, wherein the voltage driving unit comprises a pull-down driver which is configured to pull-down drive the through via and discharge the through via, in response to the test control signal.

7. The test circuit according to claim 1, further comprising:
an output unit configured to output one of the input voltage and the resultant signal in response to the test control signal.

8. A semiconductor integrated circuit comprising:
a first chip including a first chip through via configured to be charged by receiving an input voltage, a first chip voltage driving unit electrically connected with the first chip through via and configured to generate a first chip test voltage by supplying an additional charge to the charged first chip through via using an external voltage or discharging the charged first chip through via using a ground voltage, and a first chip determination unit configured to compare levels of the input voltage and the first chip test voltage and generate a first chip resultant signal based on the comparison of levels of the input voltage and the first chip test voltage; and
a second chip including a second chip through via electrically connected with the first chip through via and configured to be charged by receiving the input voltage through the first chip through via, a second chip voltage driving unit configured to generate a second chip test voltage by supplying an additional charge to the charged second chip through via using an external voltage or discharging the charged second chip through via using a ground voltage, and a second chip determination unit configured to compare levels of the input voltage and the second chip test voltage and generate a second chip resultant signal based on the comparison of levels of the input voltage and the second chip test voltage.

9. The semiconductor integrated circuit according to claim 8, wherein the first chip voltage driving unit is deactivated when the first chip through via is electrically connected to the second chip through via.

10. The semiconductor integrated circuit according to claim 8, wherein the first chip voltage driving unit includes one or more of a pull-up driver which is configured to pull-up drive the first chip through via and charge the first chip through via, and a pull-down driver which is configured to pull-down drive the first chip through via and discharge the first chip through via.

11. The semiconductor integrated circuit according to claim 8, wherein the second chip voltage driving unit includes one or more of a pull-up driver which is configured to pull-up drive the second chip through via and charge the second chip through via, and a pull-down driver which is configured to pull-down drive the second chip through via and discharge the second chip through via.

12. The semiconductor integrated circuit according to claim 8, wherein the first chip further comprises:
a first output unit configured to output one of the input voltage and the first chip resultant signal in response to a test mode signal.

13. The semiconductor integrated circuit according to claim 8, wherein the second chip further comprises:
a second output unit configured to output one of the input voltage and the second chip resultant signal in response to a test mode signal.

14. A test method of a semiconductor integrated circuit, comprising:
charging a through via by applying an input voltage;
generating a first test voltage by a voltage driving unit, wherein the voltage driving unit is configured to generate the first test voltage by supplying an additional charge to the charged through via using an external voltage or discharging the charged through via using a ground voltage for a first time;
comparing levels of the input voltage and the first test voltage and generating a first resultant signal based on the comparison of the levels of the input voltage and the first test voltage;
generating a second test voltage by charging or discharging the through via for a second time; and
comparing levels of the input voltage and the second test voltage and generating a second resultant signal based on the comparison of the levels of the input voltage and the second test voltage.

15. The test method according to claim 14, further comprising a step of:
after generating the first test voltage, differentially amplifying the input voltage and the first test voltage.

16. The test method according to claim 14, further comprising a step of:
after generating the second test voltage, differentially amplifying the input voltage and the second test voltage.

17. The test method according to claim 14, wherein the first resultant signal and the second resultant signal are output during a test operation, and the first resultant signal and the second resultant signal are prevented from being output when the test operation is not performed.

* * * * *